United States Patent
Mochizuki et al.

(10) Patent No.: US 12,123,093 B2
(45) Date of Patent: Oct. 22, 2024

(54) FILM FORMING DEVICE

(71) Applicant: FUJIFILM CORPORATION, Tokyo (JP)

(72) Inventors: Yoshihiko Mochizuki, Kanagawa (JP); Tomokazu Seki, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 364 days.

(21) Appl. No.: 17/674,856

(22) Filed: Feb. 18, 2022

(65) Prior Publication Data
US 2022/0170158 A1 Jun. 2, 2022

Related U.S. Application Data

(63) Continuation of application No. PCT/JP2020/033691, filed on Sep. 4, 2020.

(30) Foreign Application Priority Data

Sep. 30, 2019 (JP) ................................. 2019-178295

(51) Int. Cl.
*H05H 1/26* (2006.01)
*C23C 16/515* (2006.01)

(52) U.S. Cl.
CPC ............. *C23C 16/515* (2013.01); *H05H 1/26* (2013.01)

(58) Field of Classification Search
CPC ................ C23C 16/515; C23C 16/402; C23C 16/45574; C23C 16/45576;
(Continued)

(56) References Cited

U.S. PATENT DOCUMENTS 5,597,456 A * 1/1997 Maruyama .......... A61L 33/0094
204/164
6,465,964 B1 * 10/2002 Taguchi .................. H01J 37/32
315/111.21
(Continued)

FOREIGN PATENT DOCUMENTS

JP 2001-006897 A 1/2001
JP 2004-91837 A 3/2004
(Continued)

OTHER PUBLICATIONS

Machine translation of JP 5635788 from https://www.jpo.go.jp/e/index.html. (Year: 2024).*
(Continued)

*Primary Examiner* — Rudy Zervigon
(74) *Attorney, Agent, or Firm* — SOLARIS Intellectual Property Group, PLLC

(57) ABSTRACT

Provided is a film forming device that deposits, on a substrate, a product generated by decomposing raw material gas by a plasma discharged from a discharge port of a double tube, the device including: an inner tube through which raw material gas containing a film-forming raw material flows and is guided to the discharge port on a downstream side; an outer tube that has the inner tube inserted thereinto and through which plasma-generating gas flows and a plasma generated by discharge is guided to the discharge port on the downstream side; a first electrode that is formed in an annular shape around the outer tube and grounded; and a second electrode that is formed in an annular shape around the outer tube and to which a voltage is applied. The second electrode is disposed on the downstream side with respect to the first electrode, and assuming that a length of the second electrode in an axial direction is L1 and a diameter of the outer tube is D1, a relationship of L1≥D1 is satisfied.

10 Claims, 15 Drawing Sheets

(58) Field of Classification Search
CPC ............ C23C 16/45595; C23C 16/503; C23C 16/513; C23C 16/507; C23C 16/455; C23C 16/45591; C23C 16/4412; C23C 16/452; H05H 1/26; H05H 2245/40; H05H 1/246; H01J 37/32568; H01J 37/32825; H01J 37/321; H01J 37/32082; H01J 37/3244; H01J 37/32174
USPC .................. 118/723 ER; 156/345.48, 345.49
See application file for complete search history.

(56) References Cited

U.S. PATENT DOCUMENTS

| | | | | |
|---|---|---|---|---|
| 8,277,616 | B2 * | 10/2012 | Liu ...................... | A61B 18/042 433/217.1 |
| 9,693,441 | B2 * | 6/2017 | Patelli ...................... | H05H 1/30 |
| 2005/0016456 | A1 * | 1/2005 | Taguchi ............... | H05H 1/2406 118/723 E |
| 2009/0014423 | A1 * | 1/2009 | Li ......................... | C01B 33/029 219/121.52 |
| 2011/0089017 | A1 * | 4/2011 | Hur ........................ | B01D 53/32 422/186 |
| 2011/0298376 | A1 * | 12/2011 | Kanegae .............. | H05H 1/4622 315/111.51 |
| 2013/0306101 | A1 * | 11/2013 | Swanson ................... | B08B 7/04 156/345.43 |
| 2015/0002017 | A1 * | 1/2015 | Huang .............. | H01J 37/32449 239/548 |

FOREIGN PATENT DOCUMENTS

| | | | |
|---|---|---|---|
| JP | 2008-98128 | A | 4/2008 |
| JP | 2011-202232 | A | 10/2011 |
| JP | 2013-001926 | A | 1/2013 |
| JP | 5635788 | B2 * | 12/2014 |
| WO | 2010/082561 | A1 | 7/2010 |

OTHER PUBLICATIONS

International Search Report issued in International Application No. PCT/JP2020/033691 on Nov. 10, 2020.
Written Opinion of the ISA issued in International Application No. PCT/JP2020/033691 on Nov. 10, 2020.
English language translation of the following: Office action dated Feb. 14, 2023 from the JPO in a Japanese patent application No. 2021-550505 corresponding to the instant patent application. This office action translation is submitted now in order to supplement the understanding of the cited reference which is being disclosed in the instant Information Disclosure Statement.
Extended European Search Report dated Oct. 5, 2022, issued in corresponding EP Patent Application No. 20870690.3.

* cited by examiner

FIG. 9

| EXPERIMENTAL EXAMPLE 1 (L1/D1 DEPENDENCE) | | | | | | | | | | | | | |
|---|---|---|---|---|---|---|---|---|---|---|---|---|---|
| | DOUBLE TUBE STRUCTURE | | | | | | SUBSTRATE | SECOND ELECTRODE | | PLASMA | | FILM | |
| No. | D1 (mm) | D2 (mm) | L1 (mm) | L1/D1 | D2/D1 | δ (mm) | BIAS (V) | CURRENT (mA) | TEMPERATURE (°C) | LUMINESCENCE INTENSITY RATIO (He/O) | REACH DISTANCE (mm) | FILM THICKNESS (mm) | CARBON CONCENTRATION (%) |
| 1 | 15 | 6 | 60 | 4.00 | 0.40 | 0 | GND | 500 | 100 | 4 | 30 | 50 | 4 |
| 2 | 15 | 6 | 30 | 2.00 | 0.40 | 0 | GND | 400 | 100 | 3 | 30 | 50 | 7 |
| 3 | 15 | 6 | 15 | 1.00 | 0.40 | 0 | GND | 310 | 100 | 2 | 30 | 50 | 12 |
| 4 | 15 | 6 | 10 | 0.67 | 0.40 | 0 | GND | 260 | 100 | 1 | 30 | 50 | 21 |
| 5 | 15 | 6 | 100 | 6.67 | 0.40 | 0 | GND | 500 | 90 | 3 | 30 | 50 | 5 |
| 6 | 15 | 6 | 150 | 10.00 | 0.40 | 0 | GND | 500 | 70 | 2 | 30 | 50 | 11 |
| 7 | 15 | 6 | 200 | 13.33 | 0.40 | 0 | GND | 500 | 50 | 1 | 30 | 50 | 18 |

STANDARD → (No. 1)
CHANGE (L1 values)

FIG. 11

EXPERIMENTAL EXAMPLE 2 (L1/D1 DEPENDENCE)

| | DOUBLE TUBE STRUCTURE | | | | | SUBSTRATE | SECOND ELECTRODE | | PLASMA | | | FILM | |
|---|---|---|---|---|---|---|---|---|---|---|---|---|---|
| No. | D1 (mm) | D2 (mm) | L1 (mm) | L1/D1 | D2/D1 | δ (mm) | BIAS (V) | CURRENT (mA) | TEMPERATURE (°C) | LUMINESCENCE INTENSITY RATIO (He/O) | REACH DISTANCE (mm) | FILM THICKNESS (mm) | CARBON CONCENTRATION (%) |
| 1 | 15 | 6 | 60 | 4.00 | 0.40 | 0 | GND | 500 | 100 | 4 | 30 | 50 | 4 |
| 2 | 10 | 6 | 60 | 6.00 | 0.60 | 0 | GND | 400 | 100 | 3 | 30 | 50 | 9 |
| 3 | 20 | 6 | 60 | 3.00 | 0.30 | 0 | GND | 500 | 80 | 3 | 30 | 50 | 10 |
| 4 | 30 | 6 | 60 | 2.00 | 0.20 | 0 | GND | 500 | 50 | 2 | 30 | 50 | 17 |
| 5 | 30 | 6 | 20 | 0.67 | 0.20 | 0 | GND | 330 | 100 | 1 | 30 | 50 | 25 |

STANDARD → No. 1

CHANGE: D1, L1 (No. 2–5)

FIG. 13

EXPERIMENTAL EXAMPLE 3 (D2/D1 DEPENDENCE)

| No. | DOUBLE TUBE STRUCTURE ||||| SUBSTRATE | SECOND ELECTRODE || PLASMA || FILM ||
| --- | --- | --- | --- | --- | --- | --- | --- | --- | --- | --- | --- | --- |
| | D1 (mm) | D2 (mm) | L1 (mm) | L1/D1 | D2/D1 | δ (mm) | BIAS (V) | CURRENT (mA) | TEMPERATURE (°C) | LUMINESCENCE INTENSITY RATIO (He/O) | REACH DISTANCE (mm) | FILM THICKNESS (mm) | CARBON CONCENTRATION (%) |
| 1 | 15 | 6 | 60 | 4.00 | 0.40 | 0 | GND | 500 | 100 | 4 | 30 | 50 | 4 |
| 2 | 15 | 4 | 60 | 4.00 | 0.27 | 0 | GND | 500 | 100 | 4 | 20 | 25 | 4 |
| 3 | 15 | 8 | 60 | 4.00 | 0.53 | 0 | GND | 500 | 100 | 4 | 15 | 25 | 7 |
| 4 | 15 | 11 | 60 | 4.00 | 0.73 | 0 | GND | 500 | 100 | 4 | 5 | N.D | N.D |

STANDARD → No. 1; CHANGE: D2

FIG. 14

| EXPERIMENTAL EXAMPLE 4 (δ DEPENDENCE) | | | | | | | | | | | |
|---|---|---|---|---|---|---|---|---|---|---|---|
| | DOUBLE TUBE STRUCTURE | | | | | SUBSTRATE | SECOND ELECTRODE | | PLASMA | | FILM |
| No. | D1 (mm) | D2 (mm) | L1 (mm) | L1/D1 | D2/D1 | δ (mm) | BIAS (V) | CURRENT (mA) | TEMPERATURE (°C) | LUMINESCENCE INTENSITY RATIO (He/O) | REACH DISTANCE (mm) | FILM THICKNESS (mm) | CARBON CONCENTRATION (%) |
| 1 | 15 | 6 | 60 | 4.00 | 0.40 | 0 | GND | 500 | 100 | 4 | 30 | 50 | 4 |
| 2 | 15 | 6 | 60 | 4.00 | 0.40 | 7 | GND | 500 | 100 | 5 | 30 | 50 | 2 |
| 3 | 15 | 6 | 60 | 4.00 | 0.40 | -7 | GND | 500 | 100 | 1 | 30 | 50 | 16 |

STANDARD → (row 1)
CHANGE → (δ column rows 2, 3)

FIG. 15

EXPERIMENTAL EXAMPLE 5 (SUBSTRATE BIAS DEPENDENCE)

| No. | DOUBLE TUBE STRUCTURE | | | | | SUBSTRATE | SECOND ELECTRODE | | PLASMA | | FILM | |
|---|---|---|---|---|---|---|---|---|---|---|---|---|
| | D1 (mm) | D2 (mm) | L1 (mm) | L1/D1 | D2/D1 | δ (mm) | BIAS (V) | CURRENT (mA) | TEMPERATURE (°C) | LUMINESCENCE INTENSITY RATIO (He/O) | REACH DISTANCE (mm) | FILM THICKNESS (mm) | CARBON CONCENTRATION (%) |
| 1 | 15 | 6 | 60 | 4.00 | 0.40 | 0 | GND | 500 | 100 | 4 | 30 | 50 | 4 |
| 2 | 15 | 6 | 60 | 4.00 | 0.40 | 0 | −1000 | 500 | 100 | 4 | 30 | 50 | 2 |
| 3 | 15 | 6 | 60 | 4.00 | 0.40 | 0 | +1000 | 500 | 100 | 4 | 30 | 50 | 17 |

STANDARD → No. 1; CHANGE: BIAS

FIG. 16

EXPERIMENTAL EXAMPLE 6 (OPTIMUM CONDITION)

| No. | DOUBLE TUBE STRUCTURE | | | | | SUBSTRATE | SECOND ELECTRODE | | PLASMA | | FILM | |
|---|---|---|---|---|---|---|---|---|---|---|---|---|
| | D1 (mm) | D2 (mm) | L1 (mm) | L1/D1 | D2/D1 | δ (mm) | BIAS (V) | CURRENT (mA) | TEMPERATURE (°C) | LUMINESCENCE INTENSITY RATIO (He/O) | REACH DISTANCE (mm) | FILM THICKNESS (mm) | CARBON CONCENTRATION (%) |
| 1 | 15 | 6 | 60 | 4.00 | 0.40 | 7 | -1000 | 500 | 100 | 5 | 30 | 50 | 1 |

CHANGE

FILM FORMING DEVICE

CROSS-REFERENCE TO RELATED APPLICATIONS

This application is a continuation application of International Application No. PCT/JP2020/033691, filed Sep. 4, 2020, the disclosure of which is incorporated herein by reference in its entirety. Further, this application claims priority from Japanese Patent Application No. 2019-178295, filed on Sep. 30, 2019, the disclosure of which is incorporated herein by reference in its entirety.

BACKGROUND

1. Technical Field

The technology of the present disclosure relates to a film forming device.

2. Description of the Related Art

In general, in order to form a functional film such as an optical film, a film forming device by a vacuum film forming method such as coating, sputtering, and plasma chemical vapor deposition (CVD) is used.

In recent years, a film forming device that forms a film using atmospheric pressure plasma is also known. In a film forming method using the atmospheric pressure plasma, compared with the vacuum film forming method, productivity is high since switching between vacuum and atmospheric pressure is unnecessary and continuous processing is possible, and since a vacuum device is unnecessary, the device configuration can be simplified.

In most atmospheric pressure plasma film forming devices, a nozzle has a single tube structure (see, for example, JP2008-98128A), and a film forming device in which the nozzle has a coaxial double tube structure is also known (see, for example, JP2013-01926A and JP2004-91837A).

In the film forming device having a double tube structure, raw material gas containing a film-forming raw material flows through an inner tube, and plasma-generating gas flows through an outer tube. The plasma-generating gas is guided to a downstream discharge port as a plasma by discharge generated by a pair of electrodes (ground electrode and high voltage application electrode) disposed around the outer tube. The raw material gas is guided to the downstream discharge port through the inner tube. The plasma is gas containing active species such as charged particles (ions, electrons, and the like) and radicals. At the discharge port, the plasma merges with the raw material gas to decompose the raw material gas. A product produced by reaction promoted by the decomposition is discharged from the discharge port toward a substrate in a form of jet. The product discharged toward a surface of the substrate is deposited to form a film.

SUMMARY

In the film forming device disclosed in JP2008-98128A, since the nozzle has a single tube structure, there is a problem that deposition occurs due to decomposition of the raw material gas in the tube, and discharge cannot be performed for a long time.

On the other hand, in the film forming device disclosed in JP2013-01926A, although the nozzle has a double tube structure, since the ground electrode is disposed on a downstream side with respect to the high voltage application electrode, active species (mainly positive ions) contained in the plasma flowing in the outer tube is trapped in the ground electrode before reaching the discharge port. Ions, which are charged particles, have higher energy than radicals and have an effect of promoting the decomposition of the raw material gas and generating a high-quality film. Therefore, in a case where the ions are trapped in the ground electrode, the amount of decomposition of the raw material gas decreases. Due to the decrease in amount of decomposition, in a case where a component other than a desired component is incorporated into a film to be formed, there is a problem that the purity of the film is lowered and a film quality is deteriorated.

In the film forming device disclosed in JP2004-91837A, although the nozzle has a double tube structure, a high voltage is applied to the inner tube and the outer tube is grounded. In this configuration, since the outer tube serves as a ground electrode, active species (mainly positive ions) contained in the plasma flowing in the outer tube is trapped in the outer tube. Therefore, in the film forming device disclosed in JP2004-91837A, there is a problem that the quality of a film to be formed is deteriorated due to a decrease in amount of decomposition of the raw material gas, as in the case of the film forming device disclosed in JP2013-01926A.

Further, in the film forming device having a double tube structure, there is a problem that it is difficult to obtain a plasma having a uniform distribution at the discharge port. Specifically, the ignition of the plasma generated between the high voltage electrode and the ground electrode is local discharge in a form of lightning. Therefore, the distribution of the generated plasma may not spread sufficiently in a radial direction of the outer tube during the flow of the plasma toward the discharge port, and may reach the discharge port with non-uniformity. As described above, in a case where the plasma distribution does not insufficiently spread, the amount of decomposition of the raw material gas decreases, and the quality of the film to be formed is deteriorated.

In the film forming device having a double tube structure, since the ignition of the plasma occurs in a local portion in a circumferential direction of the tube, the spread of the plasma distribution in the circumferential direction during the flow of the plasma from an ignition portion to the discharge port becomes insufficient, and the amount of decomposition of the raw material gas decreases. As described above, a degree of spread of the plasma distribution in the circumferential direction is also caused by the deterioration in film quality.

An object of the technology of the present disclosure is to provide a film forming device having a double tube structure capable of improving a film quality.

In order to achieve the object, there is provided a film forming device that deposits, on a substrate, a product generated by decomposing raw material gas by a plasma discharged from a discharge port of a double tube, the device comprising: an inner tube through which raw material gas containing a film-forming raw material flows and is guided to the discharge port on a downstream side; an outer tube that has the inner tube inserted thereinto and through which plasma-generating gas flows and a plasma generated by discharge is guided to the discharge port on the downstream side; a first electrode that is formed in an annular shape around the outer tube and grounded; and a second electrode that is formed in an annular shape around the outer tube and to which a voltage is applied. The second electrode is disposed on the downstream side with respect to the first electrode, and assuming that a length of the second electrode in an axial direction is L1 and a diameter of the outer tube is D1, a relationship of L1≥D1 is satisfied.

It is preferable that a relationship of 1≤L1/D1≤10 is satisfied.

It is preferable that assuming that a diameter of the inner tube is D2, a relationship of D2/D1≤0.7 is satisfied.

It is preferable that at the discharge port, a protrusion amount of an end part of the inner tube in the axial direction with respect to an end part of the outer tube is 0 or more.

It is preferable that the substrate is an insulator, and that a third electrode is formed on a surface of the substrate opposite to a surface facing the discharge port. It is preferable that the third electrode is grounded. A negative voltage may be applied to the third electrode. It is preferable that the negative voltage applied to the third electrode is a direct current or a direct current pulse.

It is preferable that the film forming device further comprises a transport unit that relatively moves the substrate with respect to the discharge port.

It is preferable that an AC voltage or a pulsed voltage having a frequency of 500 kHz or less is applied to the second electrode.

According to the technology of the present disclosure, it is possible to provide a film forming device having a double tube structure capable of improving a film quality.

BRIEF DESCRIPTION OF THE DRAWINGS

Exemplary embodiments according to the technique of the present disclosure will be described in detail based on the following figures, wherein:

FIG. 9 is a table showing experimental results regarding L1/D1 dependence of a film quality, FIGS. 10A to 10C are graphs showing L1/D1 dependence of a carbon concentration of a film, and a current and a temperature of a second electrode, in which FIG. 10A shows the L1/D1 dependence of the carbon concentration, FIG. 10B shows the L1/D1 dependence of the current, and the FIG. 10C shows the L1/D1 dependence of the temperature, FIG. 11 is a table showing experimental results regarding the L1/D1 dependence of the film quality, FIG. 13 is a table showing experimental results regarding the D2/D1 dependence of the film quality, FIG. 14 is a table showing experimental results regarding δ dependence of the film quality, FIG. 15 is a table showing experimental results regarding substrate bias dependence of the film quality, and FIG. 16 is a table showing experimental results under optimum conditions.

DETAILED DESCRIPTION

First Embodiment

Next, a film forming device according to an embodiment of the present disclosure will be described. A film forming device according to a first embodiment is an atmospheric pressure plasma film forming device in which chemical reaction is promoted by decomposing raw material gas by a plasma generated under an atmospheric pressure, and a product generated by the chemical reaction is deposited on a surface of a substrate.

Figure 1:
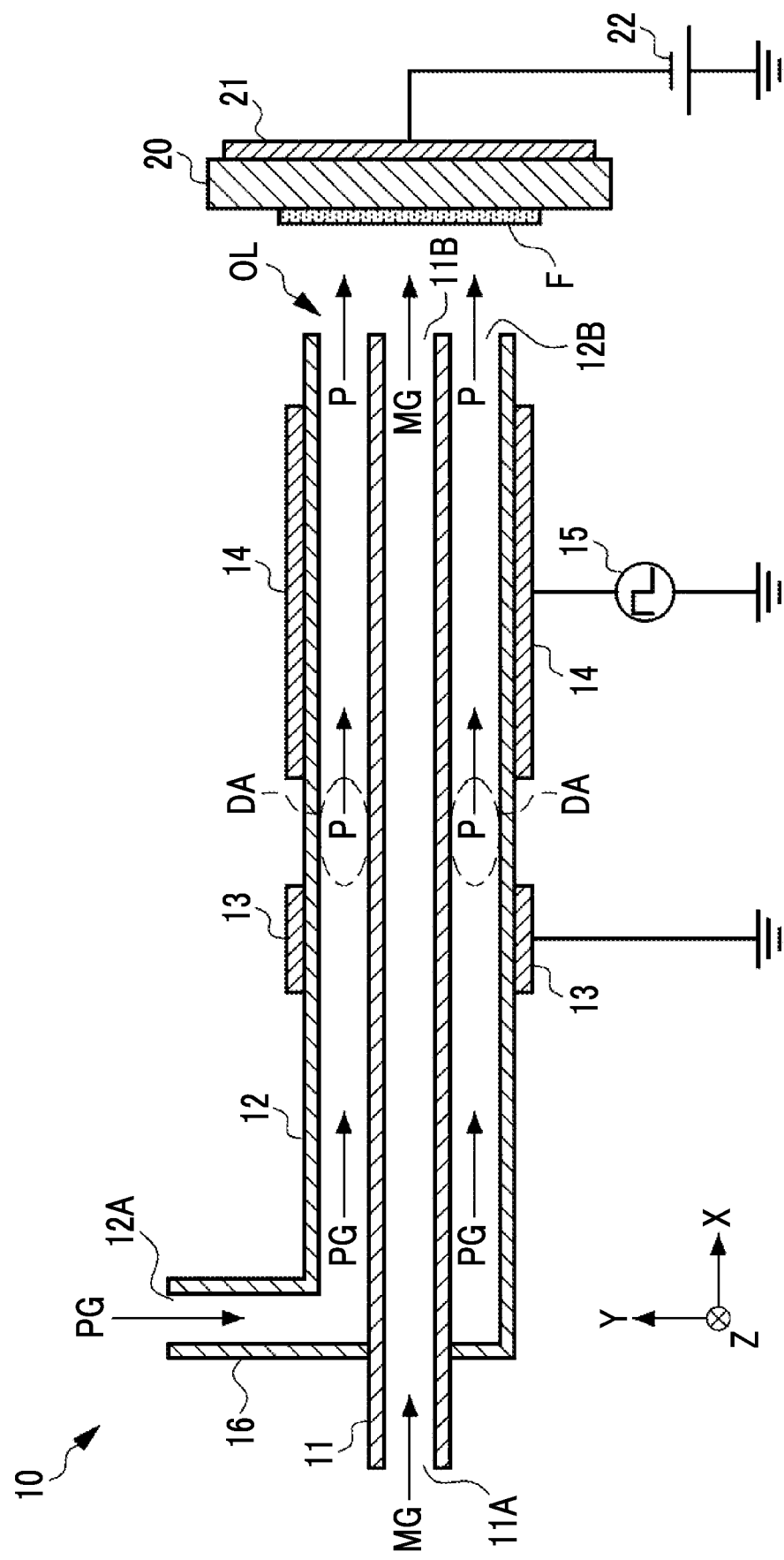
FIG. 1 is a diagram showing a configuration of a film forming device according to a first embodiment.
Figure 2:
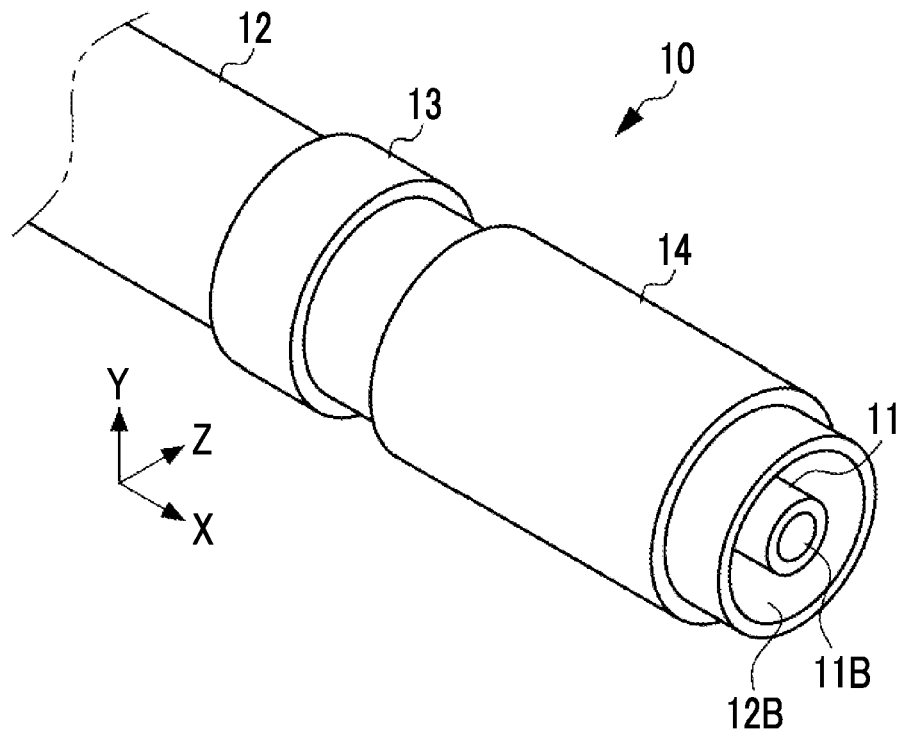
FIG. 2 is a perspective view of the film forming device according to the first embodiment.

In FIGS. 1 and 2, a film forming device 10 has an inner tube 11 as a first nozzle, an outer tube 12 as a second nozzle, a first electrode 13 as a ground electrode, a second electrode 14 as a high voltage application electrode, and a first power supply 15 as a high voltage power supply. In addition, the film forming device 10 has a substrate 20 as the object for film formation, a third electrode 21 provided on a back surface side of the substrate 20, and a second power supply 22 for biasing the substrate 20.

The inner tube 11 is inserted inside the outer tube 12. In the present embodiment, the inner tube 11 and the outer tube 12 are circular tubes, respectively, and are disposed such that central axes of the inner tube 11 and the outer tube 12 coincide with each other. That is, the inner tube 11 and the outer tube 12 form a nozzle having a coaxial double tube structure. The inner tube 11 and the outer tube 12 are formed of an insulating material (dielectric material) having a high melting point. As the insulating material forming the inner tube 11 and the outer tube 12, for example, a glassy material such as quartz, or a ceramic material such as alumina is used.

In FIGS. 1 and 2, a longitudinal direction, which is a central axis direction of the inner tube 11 and the outer tube 12, is an X direction, one direction orthogonal to the X direction is a Y direction, and a direction orthogonal to the X direction and the Y direction is a Z direction. That is, the central axes of the inner tube 11 and the outer tube 12 are parallel to the X direction, and a cross-sectional shape thereof in a YZ plane is circular.

The inner tube 11 forms a flow passage through which raw material gas MG containing a film-forming raw material flows. An end part of the inner tube 11 on an upstream side is open as an inlet 11A for the raw material gas MG. An end part of the inner tube 11 on a downstream side is open as an outlet 11B for the raw material gas MG.

The outer tube 12 forms a flow passage through which plasma-generating gas PG flows between the outer tube 12 and the inner tube 11. A supply passage 16 for supplying the plasma-generating gas PG to the flow passage in the outer tube 12 is formed at an end part of the outer tube 12 on the upstream side. An inlet 12A for guiding the plasma-generating gas PG to the supply passage 16 is formed in the supply passage 16. In addition, an end part of the outer tube 12 on the downstream side is open as an outlet 12B for a plasma P generated in the outer tube 12.

In the present embodiment, the end part (outlet 11B) of the inner tube 11 on the downstream side and the end part (outlet 12B) of the outer tube 12 on the downstream side are located at the same position in the X direction. The outlet 11B and the outlet 12B form a discharge port OL of a double tube including the inner tube 11 and the outer tube 12. At the discharge port OL, the plasma P merges with the raw material gas MG.

A raw material gas supply unit (not shown) is connected to the inlet 11A of the inner tube 11. The raw material gas MG is supplied from the raw material gas supply unit to the inside of the inner tube 11 via the inlet 11A at a constant flow rate. In the present embodiment, for the purpose of forming a film of silicon dioxide ($SiO_2$) on a surface of a substrate 20, the raw material gas MG containing tetraethoxysilane (TEOS) as a raw material is used. Oxygen ($O_2$) gas as reaction gas, nitrogen ($N_2$) gas as carrier gas, and the like are mixed in the raw material gas MG.

The raw material, the reaction gas, and the carrier gas contained in the raw material gas MG are not limited to those described above. The raw material is not limited to gas and may be solid. The reaction gas and the carrier gas may be the same kind of gas (for example, oxygen gas). In addition, the raw material gas MG may contain gas other than the reaction gas and the carrier gas.

In the present embodiment, for example, flow rates of the raw material (TEOS), the reaction gas (oxygen gas), and the carrier gas (nitrogen gas) contained in the raw material gas MG supplied from the raw material gas supply unit to the inner tube 11 are set to 0.003 liters/minute, 0.5 liters/minute, and 1 liter/minute, respectively.

The raw material gas MG supplied from the raw material gas supply unit to the inlet 11A of the inner tube 11 is discharged to the outside from the outlet 11B.

A plasma-generating gas supply unit (not shown) is connected to the inlet 12A of the outer tube 12. The plasma-generating gas PG is supplied from the plasma-generating gas supply unit to the inside of the outer tube 12 at a constant flow rate. In the present embodiment, for example, helium (He) gas is used as the plasma-generating gas PG. In a case where helium gas is used as the plasma-generating gas PG, the plasma P generated by the helium gas has a long life metastable species, so that a glow atmospheric pressure plasma that is stable at a relatively low temperature is obtained. The plasma-generating gas PG is not limited to helium, and gas such as argon, neon, or hydrogen may be used alone or in combination.

In the present embodiment, for example, a flow rate of the plasma-generating gas PG (helium gas) supplied from the plasma-generating gas supply unit to the outer tube 12 is set to 3 liters/minute.

The first electrode 13 and the second electrode 14 are formed in an annular shape around the outer tube 12. In the present embodiment, cross-sectional shapes of the first electrode 13 and the second electrode 14 in the YZ plane are circular, respectively. The first electrode 13 and the second electrode 14 are separated from each other in the X direction. The second electrode 14 is disposed on the downstream side (side of discharge port OL) with respect to the first electrode 13. The first electrode 13 and the second electrode 14 are formed of a conductive metal material such as copper, aluminum, brass, or stainless steel.

The first electrode 13 is grounded. The first power supply 15 as a high voltage power supply is connected to the second electrode 14. In the present embodiment, for example, the first power supply 15 is a bipolar pulse power supply, and a pulsed voltage having a constant frequency is applied to the second electrode 14. In the present embodiment, the frequency of the pulsed voltage generated by the first power supply 15 is set to 50 kHz. In addition, in the present embodiment, for example, a peak voltage of the pulsed voltage is set to 10 kV, and a pulse width is set to 2 microseconds. The first power supply 15 is not limited to the bipolar pulse power supply, and may be an AC power supply that generates a voltage (AC voltage) having a continuous waveform such as a sine wave. Note that the bipolar pulse power supply is superior to the AC power supply in that the charging of the substrate 20 is suppressed.

In a case where a voltage is applied to the second electrode 14 from the first power supply 15, discharge such as streamer discharge occurs under an atmospheric pressure in a region (discharge region) DA between the first electrode 13 and the second electrode 14 in the outer tube 12. Each discharge is discharge in a form of lightning, which occurs in a local portion in a circumferential direction of the outer tube 12. This discharge acts on the plasma-generating gas PG flowing in the discharge region DA to generate the plasma P.

The plasma P is gas containing active species such as charged particles (ions, electrons, and the like) and radicals. The plasma P generated in the discharge region DA flows to the downstream side and is discharged to the outside from the outlet 12B in a form of jet.

The plasma P discharged from the outlet 12B merges with the raw material gas MG discharged from the outlet 11B and is mixed. By this mixing, the active species contained in the plasma P decompose the raw material gas MG. By this decomposition, a product ($SiO_2$) generated by promoting the chemical reaction represented by the following reaction formula is discharged toward the substrate 20. As a result, the product is deposited on the surface of the substrate 20 to form an $SiO_2$ film F.

$$Si(OC_2H_5)_4 + 12O_2 \rightarrow SiO_2 + 8CO_2 + 10H_2O$$

A molecular structure of the TEOS contains carbon, hydrogen, and the like, and a concentration of carbon, hydrogen, and the like contained in $SiO_2$ film F affects the film quality. In a case where the decomposition of the raw material gas MG by the plasma P is insufficient, the purity of the $SiO_2$ film F is lowered. The higher the purity of the $SiO_2$ film F, the better the quality of the $SiO_2$ film F.

The more efficiently the active species contained in the plasma P discharged from the outlet 12B is propagated to the substrate 20, the more the decomposition and the chemical reaction of the raw material gas MG in the vicinity of the surface of the substrate 20 are promoted. As a result, the purity of the $SiO_2$ film F is increased, and the quality of the $SiO_2$ film F is improved.

The substrate 20 is a flat plate-shaped insulating substrate, and one surface thereof faces the discharge port OL of the double tube. The surface of the substrate 20 facing the discharge port OL is parallel to a YZ plane. The third electrode 21 is formed on a surface (back surface) of the substrate 20 opposite to the surface facing the discharge port OL. The second power supply 22 is connected to the third electrode 21.

In a case where the distance between the substrate 20 and the discharge port OL is extremely short, abnormal discharge occurs between the substrate 20 and the second electrode 14, and conversely, in a case where the distance is extremely long, the active species contained in the plasma P discharged from the discharge port OL is deactivated. In the present embodiment, for example, the distance between the substrate 20 and the discharge port OL is set to 10 mm. The substrate 20 is preferably an insulator in order to prevent the above-described abnormal discharge. In the present embodiment, for example, the substrate 20 is an acrylic plate.

The third electrode 21 substantially covers the back surface of the substrate 20. The third electrode 21 is a conductive metal such as copper. The second power supply 22 applies a negative voltage in order to allow the active species (mainly positive ions) contained in the plasma P to reach the surface of the substrate 20 and to promote the reaction in the vicinity of the surface of the substrate 20. This negative voltage is a direct current or a direct current pulse.

The surface of the substrate 20 is polarized by receiving a voltage applied from the second power supply 22 to the third electrode 21, and a surface potential is generated. By the surface potential generated in the substrate 20, the active species contained in the plasma P discharged from the discharge port OL receives electric energy to increase the density. As a result, the decomposition and the chemical reaction of the raw material gas MG in the vicinity of the surface of the substrate 20 are promoted, and the film quality is improved. The third electrode 21 may be grounded.

The larger the thickness of the substrate 20, the lower the distance that the active species reaches, and the smaller the thickness, the more likely the abnormal discharge is to occur. In the present embodiment, for example, the thickness of the substrate 20 is set to 10 mm.

Figure 3:
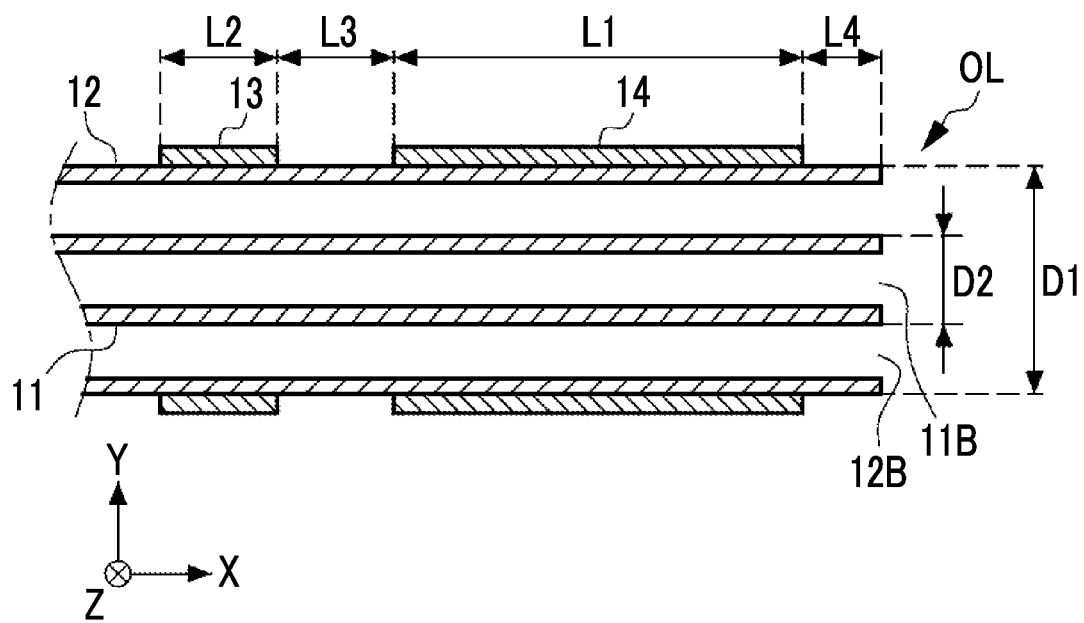
FIG. 3 is a diagram defining the size of each part of a double tube.

FIG. 3 defines the size of each part of the double tube formed of the inner tube 11 and the outer tube 12. As shown in FIG. 3, the diameter (outer diameter) of the outer tube 12 is D1, and the diameter (outer diameter) of the inner tube 11 is D2. In addition, the length of the second electrode 14 in the axial direction (X direction) is L1, the length of the first electrode 13 in the axial direction is L2, and the distance between the first electrode 13 and the second electrode 14 in the axial direction is L3. Further, the distance from an end part of the second electrode 14 to the outlet 12B of the outer tube 12 is L4.

In a case where the distance L4 is shortened, the distance between the second electrode 14 and the substrate 20 is shortened, so that the active species contained in the plasma P can easily reach the substrate 20 without being deactivated, but in a case where the distance L4 is extremely short, the abnormal discharge easily occurs between the substrate 20 and the second electrode 14. Although there is a concern about the abnormal discharge, it is also possible to set "L4=0" in order to give priority to the improvement of the reach distance of the plasma P.

In the present embodiment, for example, D1=15 mm, D2=6 mm, L1=60 mm, L2=10 mm, L3=20 mm, and L4=10 mm. In addition, the wall thicknesses of the inner tube 11 and the outer tube 12 are each set to, for example, 1 mm.

The inner diameter (diameter) of the inner tube 11 and the outer tube 12 is substantially the same as the outer diameter (diameter) D1 of the outer tube 12.

In the present embodiment, the second electrode 14 as the high voltage application electrode is disposed on the downstream side with respect to the first electrode 13 as the ground electrode. In a case where the first electrode 13 is disposed on the downstream side with respect to the second electrode 14, the active species (mainly positive ions) contained in the plasma P generated in the discharge region DA is trapped in the outer tube 12 in a case where the plasma P flows toward the outlet 12B. Since ions, which are charged particles, have higher energy than radicals and have an effect of promoting the decomposition of the raw material gas and generating a high-quality film, the amount of decomposition of the raw material gas decreases by trapping the ions in the ground electrode, and the purity of the $SiO_2$ film F is lowered. As a result, the quality of the film F to be formed is deteriorated.

On the other hand, in the present embodiment, since the second electrode 14 is disposed on the downstream side with respect to the first electrode 13, the plasma P generated in the discharge region DA does not pass through a region where the first electrode 13 as the ground electrode is disposed in a case of flowing toward the outlet 12B. As a result, the active species (mainly positive ions) contained in the plasma P is not trapped in the outer tube 12 in a case of flowing toward the outlet 12B, and is discharged to the outside from the outlet 12B.

Figure 4:
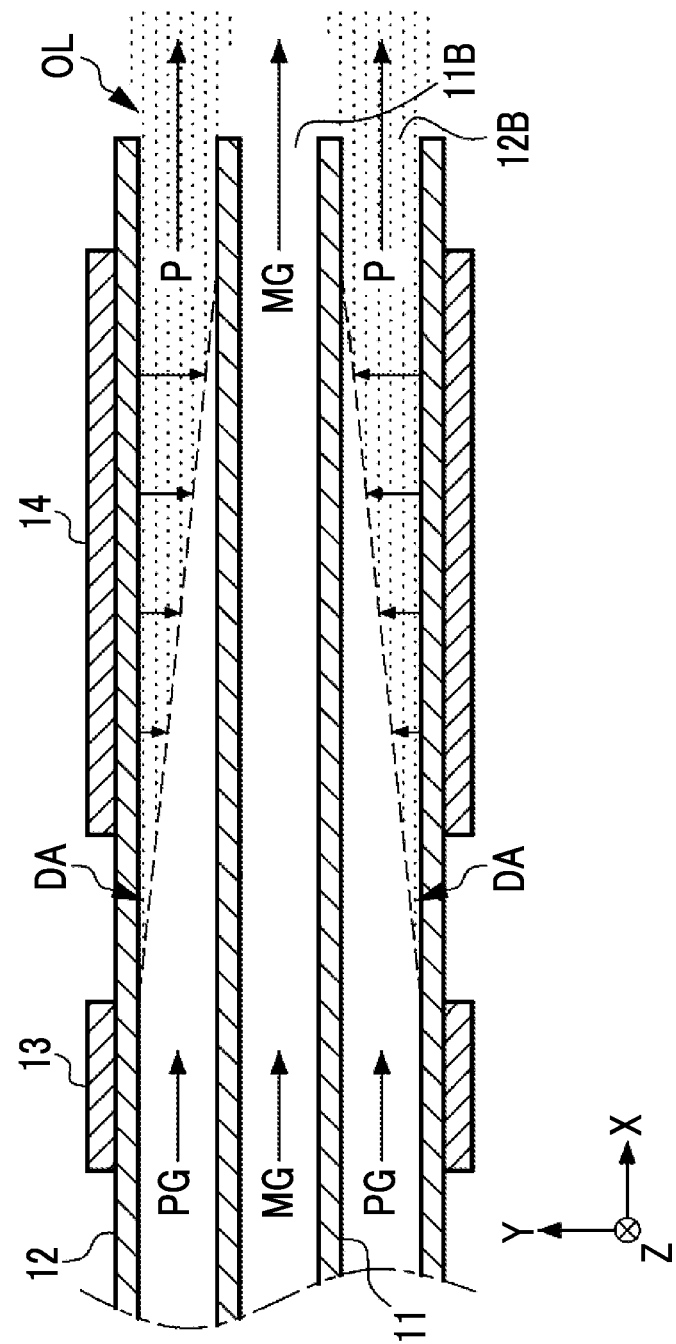
FIG. 4 is a diagram illustrating a state where the distribution of a plasma spreads in a radial direction of an outer tube.
Figure 5:
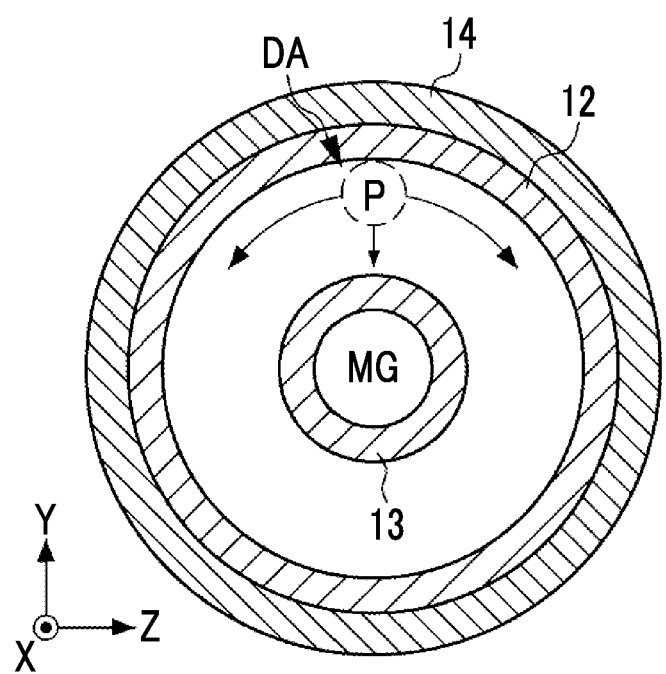
FIG. 5 is a diagram illustrating a state where the distribution of the plasma spreads in a circumferential direction of the outer tube.

In addition, the second electrode 14 is disposed on the downstream side with respect to the first electrode 13, whereby the active species contained in the plasma P generated in the discharge region DA continues to receive electric energy by the electric field generated by the second electrode 14 in a case of flowing toward the outlet 12B. As a result, as shown in FIG. 4, the distribution of the plasma P spreads in a radial direction of the outer tube 12 (the center direction of the outer tube 12) as it flows downstream. As shown in FIG. 5, the plasma P locally generated in the discharge region DA receives electric energy in a case of flowing toward the outlet 12B, and the distribution of the plasma P spreads in the circumferential direction.

In the present embodiment, the length L1 of the second electrode 14 in the axial direction and the diameter D1 of the outer tube 12 are set so as to satisfy a relationship of L1≥D1. By satisfying this relationship, the time for receiving electric energy from the second electrode 14 during the flow of the plasma P in the downstream direction becomes longer, and the distribution sufficiently spreads in the radial direction and the circumferential direction.

As described above, in the present embodiment, the reduction of the active species contained in the plasma P is suppressed and the distribution is made uniform, so that the amount of decomposition of the raw material gas MG and the processing unevenness are improved, and the quality of the film F to be formed on the substrate 20 is improved.

In the present embodiment, the end part (outlet 11B) of the inner tube 11 on the downstream side and the end part (outlet 12B) of the outer tube 12 on the downstream side are located at the same position in the axial direction. As a result, the plasma P and the raw material gas MG merge with each other immediately after being discharged from the discharge port OL, and the raw material gas MG is decomposed, so that the distance between the discharge port OL and the substrate 20 can be shortened, and the quality of the film F is improved.

In the present embodiment, the frequency of the voltage applied by the first power supply 15 to the second electrode 14 is set to 50 kHz. In a case where the frequency of the voltage applied to the second electrode 14 is extremely high, the charged particles contained in the plasma P are trapped in the space inside the outer tube 12 due to the reversal of the electric field, and the active species discharged from the outlet 12B is reduced. By setting the voltage applied to the second electrode 14 by the first power supply 15 to an AC voltage or a pulsed voltage having a frequency of 500 kHz or less, the number of the charged particles trapped in the space inside the outer tube 12 is reduced, and the active species discharged from the outlet 12B can be increased. As a result, the quality of the film F is improved.

Second Embodiment

Figure 6:
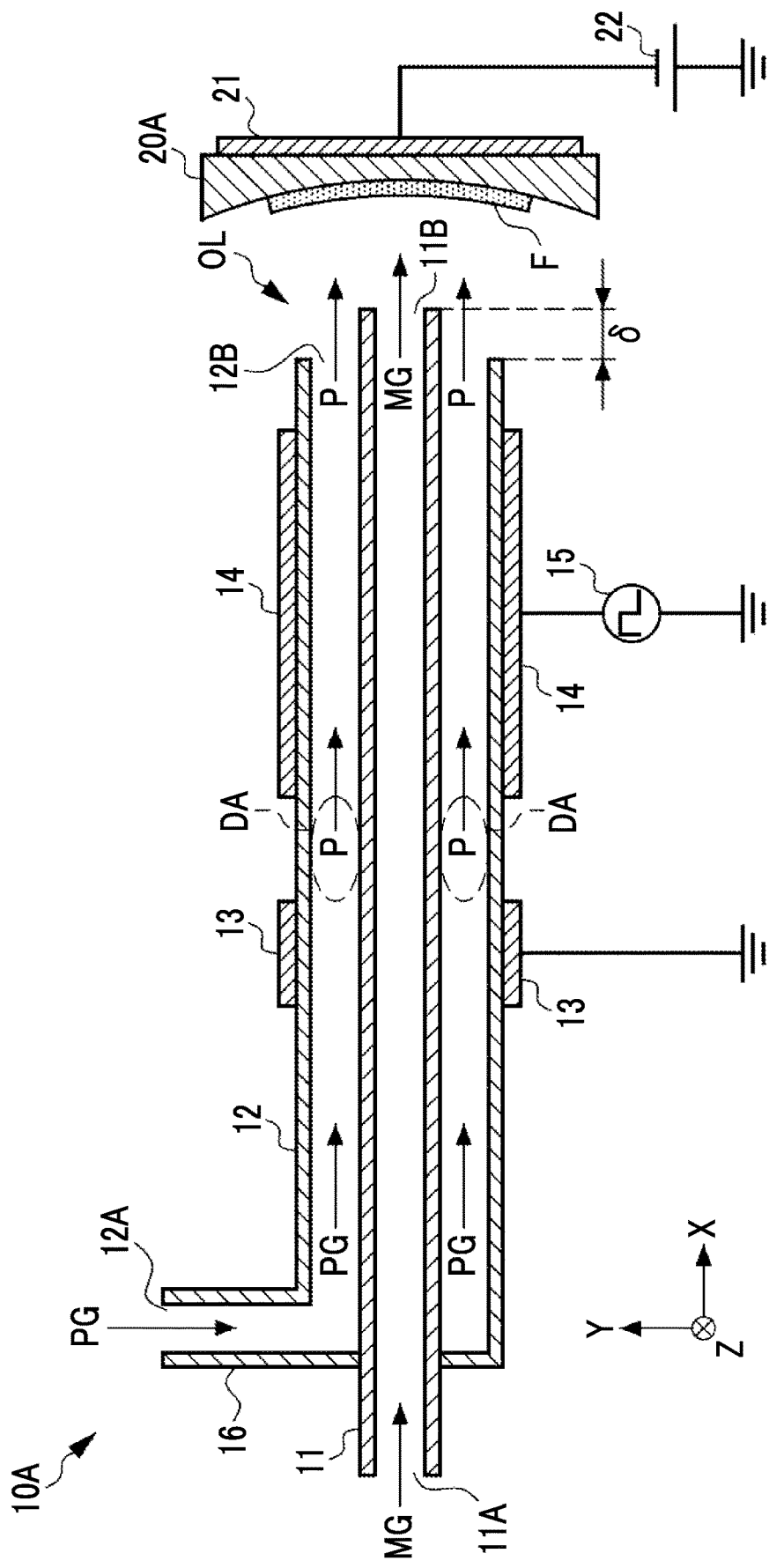
FIG. 6 is a diagram showing a configuration of a film forming device according to a second embodiment.
Figure 7:
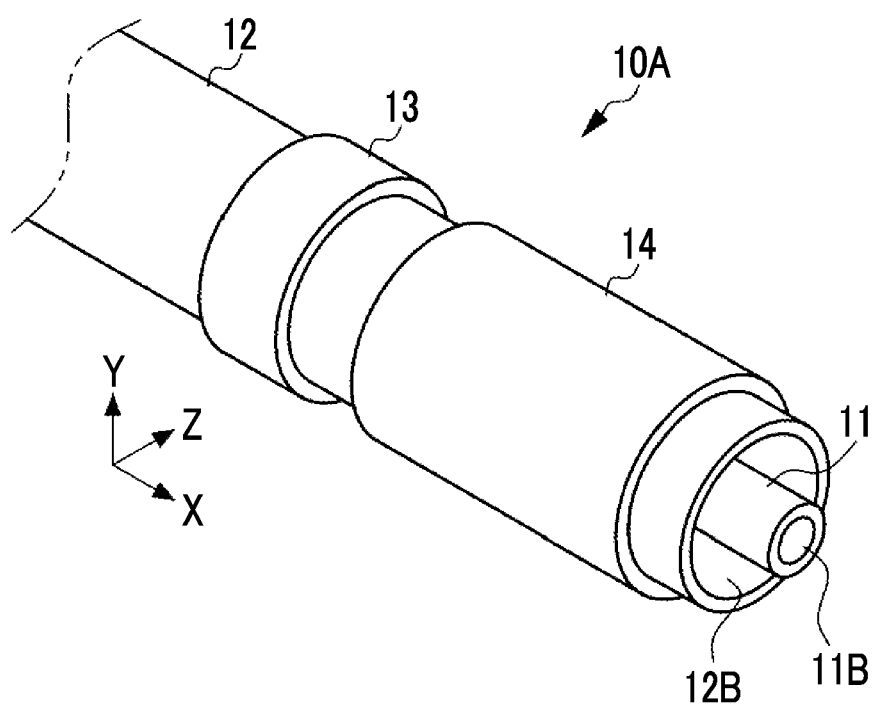
FIG. 7 is a perspective view of the film forming device according to the second embodiment.

Next, a film forming device according to a second embodiment will be described. In FIGS. 6 and 7, a film forming device 10A according to the second embodiment has an inner tube 11, an outer tube 12, a first electrode 13, a second electrode 14, and a first power supply 15, similarly to the film forming device 10 according to the first embodiment.

The film forming device 10A is different from the film forming device 10 of the first embodiment only in that an end part (outlet 11B) of the inner tube 11 on the downstream side protrudes from an end part (outlet 12B) of the outer tube 12 on the downstream side in the axial direction. As shown in FIG. 6, the protrusion amount of the end part of the inner tube 11 on the downstream side with respect to the end part of the outer tube 12 on the downstream side is defined as δ. In the present embodiment, for example, the protrusion amount δ is set to 7 mm.

As shown in FIG. 6, the film forming device 10A of the present embodiment is suitable for forming a film on a substrate 20A having a concave surface. In a case where a film is formed on the substrate 20A having a concave surface by the film forming device 10 of the first embodiment, there is a possibility that the outer tube 12 is brought into contact with a surface of the substrate 20A in a case where the discharge port OL approaches the substrate 20A.

On the other hand, in the film forming device 10A of the present embodiment, since the inner tube 11 protrudes at the discharge port OL, the film can be formed without bringing the outer tube 12 into contact with the surface of the substrate 20A. The inner tube 11 protrudes as in the present embodiment, whereby the plasma P does not merge with the raw material gas MG immediately after being discharged from the outlet 12B. However, even in the present embodiment, a portion where the raw material gas MG is decomposed by the plasma P and the reaction is promoted is generated immediately after the gas is discharged from the outlet 11B, and there is no significant difference from the portion where the reaction is promoted in the configuration of the first embodiment. Therefore, a film F having the same quality as that of the first embodiment can be obtained.

The film forming device 10A of the present embodiment is not limited to the substrate 20A having a concave surface, and is also suitable for forming a film on a substrate having another surface shape. The film forming device 10A of the present embodiment is also suitably used for, for example, a substrate having a convex surface.

Modification Example

Next, modification examples of the first and second embodiments will be described. In the first and second embodiments, the substrate as the object for film formation is fixed, but the film may be formed while the substrate is moved by a transport mechanism.

Figure 8:
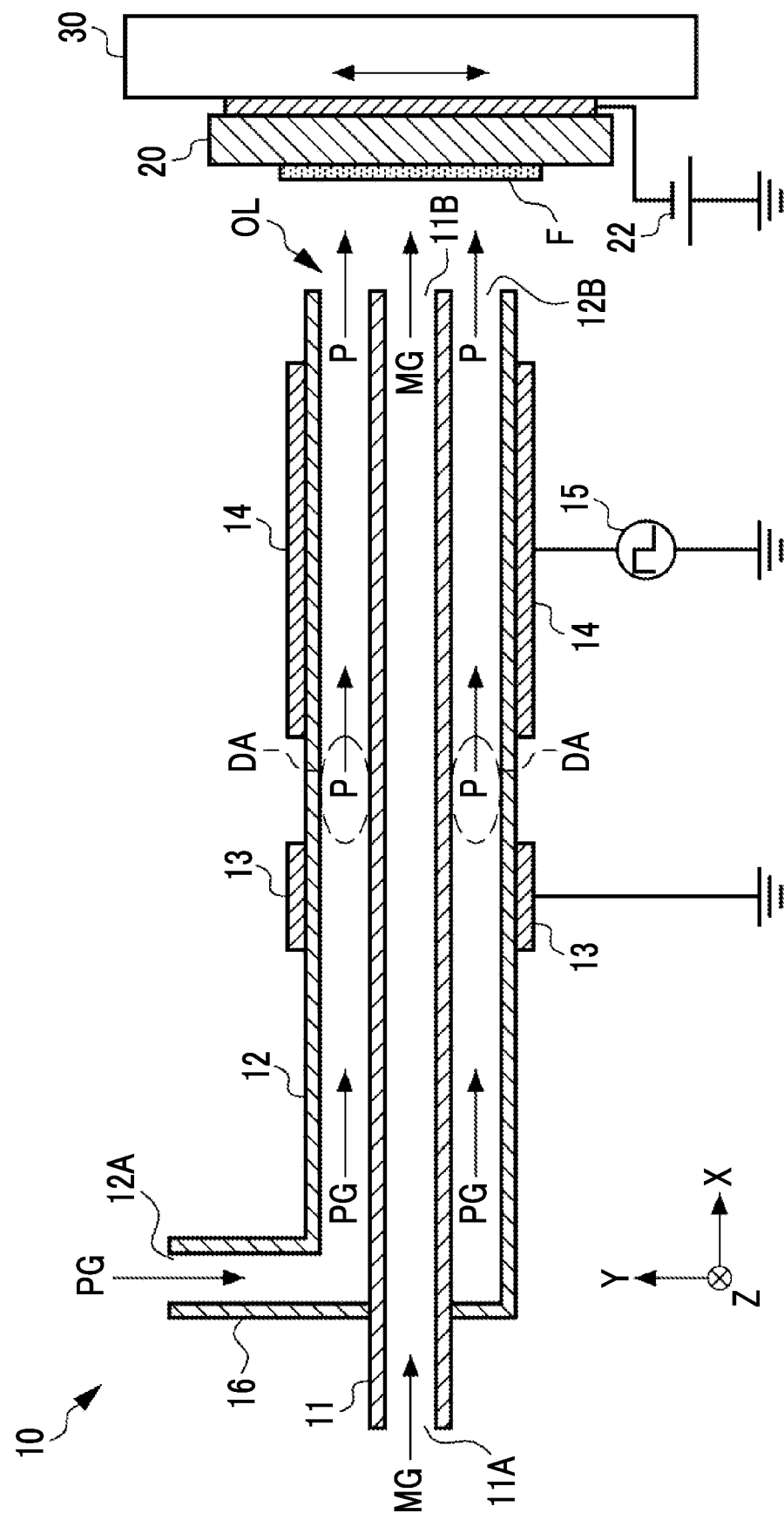
FIG. 8 is a diagram showing a configuration of a film forming device according to a modification example.

FIG. 8 shows an example in which a transport mechanism 30 that transports the substrate 20 is applied to the film forming device 10 of the first embodiment. The transport mechanism 30 is a transport unit that moves the substrate 20 in parallel to the YZ plane in a one-dimensional or two-dimensional manner. As the transport mechanism 30, a belt conveyor, a biaxial plane moving stage, or the like can be used. The transport mechanism 30 can also be applied to the film forming device 10A of the second embodiment.

The transport unit may not move the substrate as the object for film formation, but may move the double tube formed of the inner tube 11 and the outer tube 12. That is, the transport unit need only move the substrate with respect to the discharge port of the double tube.

In the first and second embodiments, the cross-sectional shapes of the inner tube 11 and the outer tube 12 and the cross-sectional shapes of the first electrode 13 and the second electrode 14 are circular, respectively, but the cross-sectional shapes are not limited to circular shapes, and may be an elliptical shape, an oval shape, an egg shape, or the like. In a case where the cross-sectional shape is a shape other than these circular shapes, the diameter need only be defined by, for example, "circle-equivalent diameter". The circle-equivalent diameter is the diameter of a circle having the same area. Therefore, the terms "tube" and "annular" in the present disclosure do not limit the cross-sectional shape to a circular shape.

Experimental Example

Next, various experimental examples of film formation using the film forming device of the first and second embodiments will be described. In each experiment, the diameter D1 of the outer tube 12, the diameter D2 of the inner tube 11, the length L1 of the second electrode 14, the protrusion amount δ of the inner tube 11, and the substrate bias were used as film forming conditions. Other film forming conditions were as shown in the first and second embodiments. In each experiment, a flat plate-shaped acrylic plate was used as the substrate.

The $SiO_2$ film F was formed on the substrate by using gas containing TEOS (raw material), $O_2$ (reaction gas), and $N_2$ (carrier gas) as the raw material gas MG and using helium gas as the plasma-generating gas PG. In each experiment, after the substrate was irradiated with plasma for 30 seconds from the film forming device, the carbon concentration and the film thickness were measured as evaluation values of the quality of the $SiO_2$ film F to be formed on the substrate. For measurement of the carbon concentration, for example, an infrared spectrophotometer was used. In addition, for measurement of the film thickness, for example, a reflection spectroscopic film thickness meter was used.

As the characteristics of the plasma P related to the film quality, the luminescence intensity ratio of helium to oxygen and the reach distance of the plasma P in the substrate direction (X direction) from the discharge port OL were measured. The luminescence intensity ratio was measured by analyzing the emission spectrum of the plasma P by a spectroscope. Specifically, the ratio of the luminescence intensity of helium to the luminescence intensity of oxygen was obtained, and the result was expressed by a value in 5 stages of 1 to 5. "5" indicates that the ratio of the luminescence intensity of helium to the luminescence intensity of oxygen is the largest. On the other hand, "1" indicates that the ratio of the luminescence intensity of helium to the luminescence intensity of oxygen is the smallest. The higher the luminescence intensity of helium, the more the decomposition of the raw material gas MG is promoted, and the purity of the $SiO_2$ film F is improved, thereby improving the quality of the $SiO_2$ film F.

The reach distance of the plasma P could be obtained by observing the emission of the plasma P on the surface of the substrate while changing the distance of the substrate with respect to the discharge port OL, and specifying the limit distance at which the emission is observed on the surface of the substrate. The longer the reach distance of the plasma P, the more the decomposition and the chemical reaction of the raw material gas MG are promoted in the vicinity of the surface of the substrate, thereby improving the film quality.

A current flowing in the second electrode 14 as the high voltage application electrode during film formation was measured. The current was measured, for example, by connecting an ammeter to a conductive wire connected between the second electrode 14 and the first power supply 15. Basically, although the current value increases as the area of the second electrode 14 increases, the increase in current value is suppressed in a case where the area of the second electrode 14 exceeds a certain value due to the limitation of the power supply capacity of the first power supply 15.

The temperature of the second electrode 14 was measured during film formation. The temperature was measured, for example, by attaching a thermo-label (registered trademark) to the second electrode 14. The temperature of the second electrode 14 rises as the current value of the second electrode 14 increases and the density of the charge discharged from the second electrode 14 increases. This is because the density of the plasma P generated in the vicinity of the second electrode 14 increases as the density of the charge discharged from the second electrode 14 increases, and the temperature of the second electrode 14 rises due to heat transfer from the plasma P.

Experimental Example 1

FIG. 9 shows experimental results regarding the L1/D1 dependence of the quality of the $SiO_2$ film F. L1/D1 is a value obtained by dividing the length L1 of the second electrode 14 by the diameter D1 of the outer tube 12. In the present experiment, the film formation was carried out based on the standard film forming condition (No. 1) as a standard and the other six film forming conditions (Nos. 2 to 7) in which the length L1 of the second electrode 14 was changed with respect to the standard film forming condition (No. 1). In the present experiment, the substrate was grounded and the protrusion amount δ of the end part of the inner tube 11 was set to "0".

Figure 10A:
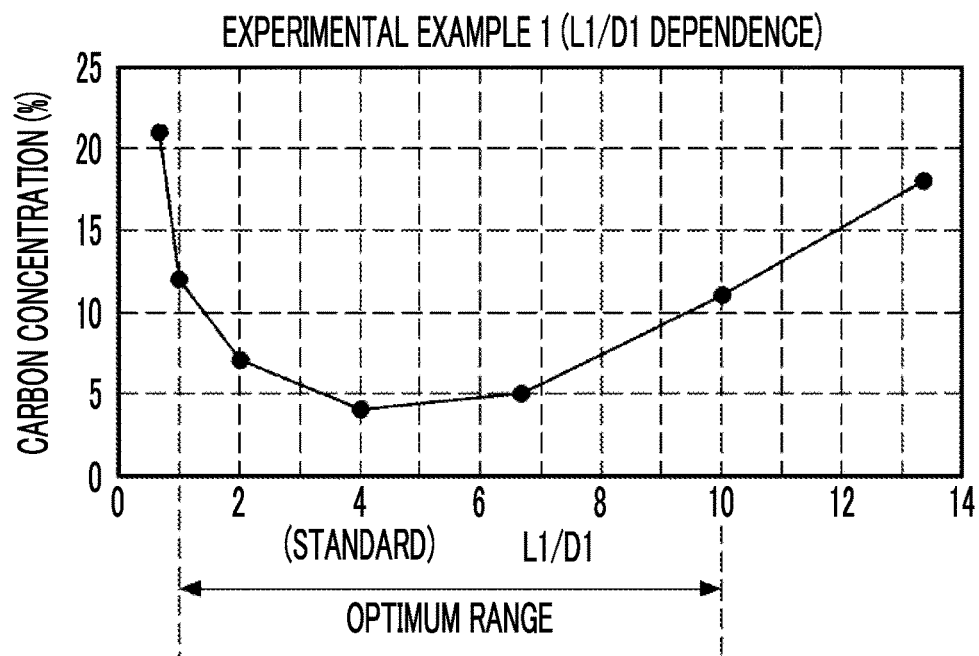
Figure 10B:
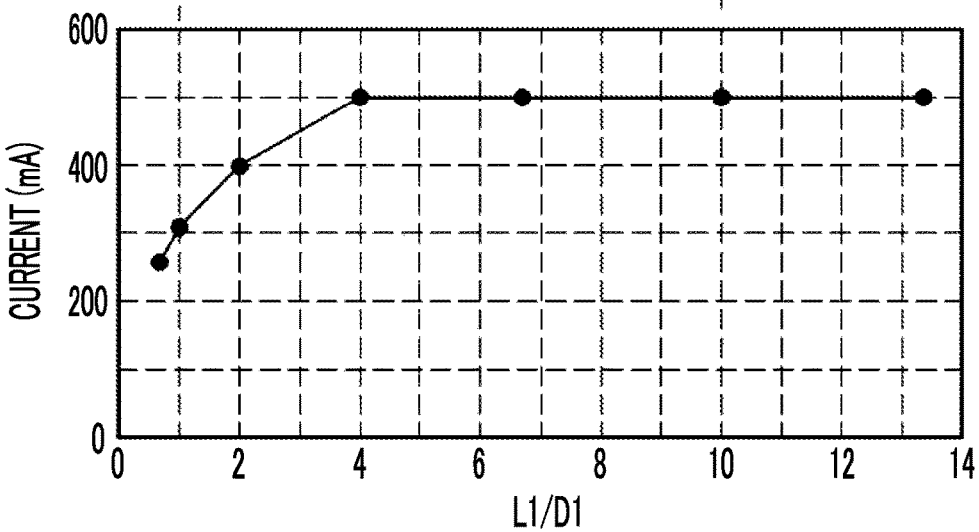
Figure 10C:
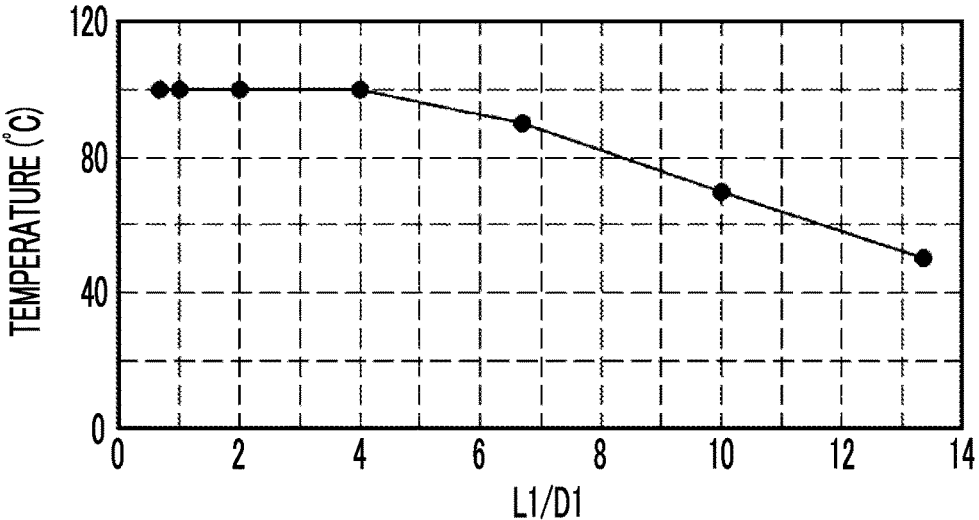

FIGS. 10A to 10C are graphs showing the L1/D1 dependence of the carbon concentration of the $SiO_2$ film F, the current flowing in the second electrode 14, and the temperature of the second electrode 14, which were created based on the experimental results shown in FIG. 9. FIG. 10A shows the L1/D1 dependence of the carbon concentration. FIG. 10B shows the L1/D1 dependence of the current. FIG. 10C shows the L1/D1 dependence of the temperature.

According to FIG. 10A, it can be seen that the carbon concentration is the lowest and the film quality is the best in a case of "L1/D1=4" as the standard film forming condition. Regardless of whether L1/D1 is made smaller or larger by changing the length L1 of the second electrode 14 from the standard film forming condition, the carbon concentration increases and the film quality is deteriorated.

In a case where the length L1 of the second electrode 14 is made shorter than the standard film forming condition, the area of the second electrode 14 decreases, so that the current value of the second electrode 14 decreases as shown in FIG. 10B, and the density of the charge discharged from the second electrode 14 decreases. Due to the decrease in density of the charge, the density of the plasma P decreases and the amount of decomposition of the raw material gas MG decreases. As a result, carbon remains in the $SiO_2$ film F and the film quality is deteriorated.

On the other hand, in a case where the length L1 of the second electrode 14 is made longer than the standard film forming condition, the area of the second electrode 14 increases, but as shown in FIG. 10B, the current value is saturated due to the limitation of the power supply capacity of the first power supply 15. After the current value is saturated, in a case where the length L1 of the second electrode 14 is lengthened to increase the area thereof, on the contrary, the density of the charge discharged from the second electrode 14 decreases. The decrease in density of the charge corresponds to the decrease in temperature of the second electrode 14, as shown in FIG. 10C. As described above, as the density of the charge decreases, the density of the plasma P decreases and the amount of decomposition of the raw material gas MG decreases. As a result, the film quality is similarly deteriorated.

For example, assuming that the film quality is abnormal in a case where the carbon concentration exceeds 20%, as shown in FIGS. 9 and 10A to 10C, in a case of "L1/D1=0.67", the carbon concentration becomes 21% and the film quality is determined to be abnormal. Therefore, it is preferable that the value of L1/D1 satisfies the following equation (1).

$$1 \leq L1/D1 \tag{1}$$

Further, since the film quality is most improved in a case of "L1/D1=4" and the film quality is almost equal in a case of "L1/D1=1" and a case of "L1/D1=10", it is more preferable that the value of L1/D1 satisfies the following equation (2).

$$1 \leq L1/D1 \leq 10 \tag{2}$$

Experimental Example 2

FIG. 11 shows experimental results regarding the L1/D1 dependence of the quality of the $SiO_2$ film F. In the present experiment, the film formation was carried out based on the standard film forming condition (No. 1) as a standard and the other four film forming conditions (Nos. 2 to 5) in which the diameter D1 of the outer tube 12 was changed with respect to the standard film forming condition (No. 1). In the film forming condition (No. 5), the diameter D1 of the outer tube 12 and the length L1 of the second electrode 14 were changed.

Figure 12:
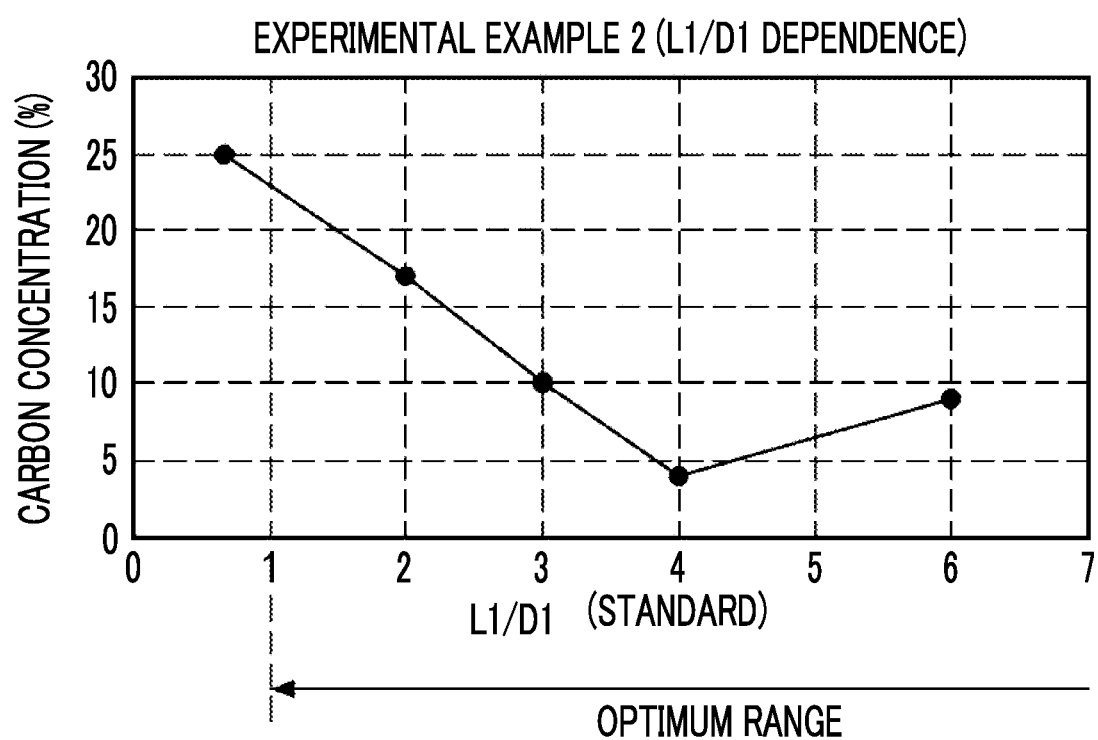
FIG. 12 is a graph showing L1/D1 dependence of a carbon concentration of a film.

FIG. 12 is a graph showing the L1/D1 dependence of the carbon concentration of the $SiO_2$ film F, which was created based on the experimental results shown in FIG. 11. According to FIG. 12, it can be seen that the carbon concentration is the lowest and the film quality is the best in a case of "L1/D1=4" as the standard film forming condition, as in Experimental Example 1. Regardless of whether L1/D1 is made smaller or larger by changing the diameter D1 of the outer tube 12 from the standard film forming condition, the carbon concentration increases and the film quality is deteriorated.

In a case where the diameter D1 of the outer tube 12 is made shorter than the standard film forming condition, the area of the second electrode 14 decreases, so that the amount of the charge discharged from the second electrode 14 decreases (the current value decreases). As a result, the density of the plasma P decreases, the amount of decomposition of the raw material gas MG decreases, and the film quality is deteriorated.

On the other hand, in a case where the diameter D1 of the outer tube 12 is made longer than the standard film forming condition, the inner volume between the inner tube 11 and the outer tube 12 increases, so that the density of the plasma P decreases. As a result, the amount of decomposition of the raw material gas MG decreases, and carbon remains in the $SiO_2$ film F, so that the film quality is deteriorated. One of the reasons for the deterioration in film quality is that the area of the second electrode 14 increases by increasing the diameter D1 of the outer tube 12, and the current value is saturated due to the limitation of the power supply capacity of the first power supply 15.

In a case where the diameter D1 of the outer tube 12 is made longer and the length L1 of the second electrode 14 is made shorter than the standard film forming condition, the inner volume of the outer tube 12 increases and the density of the charge discharged from the second electrode 14 decreases (the current value decreases). As a result, the density of the plasma P further decreases, and the film quality is deteriorated.

For example, assuming that the film quality is abnormal in a case where the carbon concentration exceeds 20%, as shown in FIGS. 11 and 12, in a case of "L1/D1=0.67", the carbon concentration becomes 21% and the film quality is determined to be abnormal. Therefore, as in a case of Experimental Example 1, it is preferable that the value of L1/D1 satisfies the above equation (1).

Experimental Example 3

FIG. 13 shows experimental results regarding the D2/D1 dependence of the quality of the $SiO_2$ film F. D2/D1 is a value obtained by dividing the diameter D2 of the inner tube 11 by the diameter D1 of the outer tube 12. In the present experiment, the film formation was carried out based on the standard film forming condition (No. 1) as a standard and the other three film forming conditions (Nos. 2 to 4) in which the diameter D2 of the inner tube 11 was changed with respect to the standard film forming condition (No. 1).

In a case where the diameter D2 of the inner tube 11 is made shorter than the standard film forming condition, the cross-sectional area of the plasma P at the discharge port OL increases, and the density of the plasma P decreases. As a result, the plasma P discharged from the discharge port OL collides with the atmosphere and is deactivated, so that the reach distance is shortened, the decomposition and the chemical reaction of the raw material gas MG in the vicinity of the surface of the substrate are lowered, thereby deteriorating the film quality.

On the other hand, in a case where the diameter D2 of the inner tube 11 is made longer than the standard film forming condition, the inner volume between the inner tube 11 and the outer tube 12 decreases, so that the density of the plasma P increases and the cross-sectional area decreases. In a case where the cross-sectional area of the plasma P decreases small in this way, the plasma P discharged from the discharge port OL collides with the atmosphere and is deactivated, so that the reach distance is shortened and the film quality is deteriorated.

As shown in FIG. 13, in a case of "D2/D1=0.73", the reach distance was shortened to 5 mm, and the value (N·D) exceeded the lower limit of the detection limit. Therefore, it is more preferable that the value of D2/D1 satisfies the following equation (3).

$$D1/D2 \leq 0.7 \qquad (3)$$

Experimental Example 4

FIG. 14 shows experimental results regarding the δ dependence of the quality of the $SiO_2$ film F. δ is the protrusion amount of the end part of the inner tube 11 shown in FIG. 6. In the present experiment, the film formation was carried out based on the standard film forming condition (No. 1) in a case of "δ=0" (that is, the first embodiment 1), the film forming condition (No. 2) in a case of "δ>0" (that is, the second embodiment), and the film forming condition (No. 3) in a case of "δ<0".

As shown in FIG. 14, it was confirmed that in a case of "δ=7 mm", the carbon concentration in the $SiO_2$ film F was lower than that in a case of "δ=0 mm" and the film quality equal to or higher than that in a case of "δ=0 mm" was obtained. That is, it is preferable that the protrusion amount δ at the end part of the inner tube 11 is 0 or more.

On the other hand, it was confirmed that in a case of "δ=−7 mm", the carbon concentration in the $SiO_2$ film F was higher than that in a case of "δ=0 mm" and the film quality was extremely lowered. This is because the end part (outlet 11B) of the inner tube 11 is located inside the end part (outlet 12B) of the outer tube 12, so that the raw material gas MG discharged from the outlet 11B is decomposed by the plasma P before the outlet 12B, and the energy of the active species contained in the plasma P is consumed.

Experimental Example 5

FIG. 15 shows experimental results regarding the substrate bias dependence of the quality of the $SiO_2$ film F. GND indicates that the substrate was grounded. In the present experiment, the film formation was carried out based on the standard film forming condition (No. 1) in a case where the substrate was grounded, the film forming condition (No. 2) in a case where a DC voltage of −1000 V was applied to the substrate, and the film forming condition (No. 3) in a case where a DC voltage of +1000 V was applied to the substrate.

As shown in FIG. 15, it was confirmed that in a case where the substrate bias is −1000 V, the carbon concentration in the $SiO_2$ film F was lower than that in a case where the substrate was grounded, and the film quality equal to or higher than that in a case where the substrate was grounded was obtained. This is because the active species contained in the plasma P discharged from the discharge port OL receives electric energy to increase the density, and the decomposition and the chemical reaction of the raw material gas MG are promoted in the vicinity of the surface of the substrate.

On the other hand, it was confirmed that in a case where the substrate bias is +1000 V, the carbon concentration in the $SiO_2$ film F was higher than that in a case where the substrate was grounded and the film quality was extremely lowered. This is because the reach of the active species (mainly positive ions) contained in the plasma P to the substrate is hindered by a positive voltage.

Experimental Example δ

FIG. 16 shows experimental results in a case where the optimum conditions were selected from the experimental results of Experimental Examples 1 to 5 and the film formation was carried out. Specifically, the optimum conditions shown in FIG. 16 are obtained by changing the protrusion amount δ of the inner tube 11 and the substrate bias from the standard film forming condition (No. 1) shown in FIG. 1. As described above, by setting "δ=7 mm" and setting the substrate bias to −1000 V, the carbon concentration in the $SiO_2$ film F was lowered, and the film quality was further improved.

The contents described and illustrated above are detailed explanations of the parts relating to the technique of the present disclosure, and are merely examples of the technique of the present disclosure. For example, description related to the above configurations, functions, actions, and effects is description related to an example of configurations, functions, actions, and effects of the parts according to the embodiments of the technology of the present disclosure. Therefore, unnecessary portions may be deleted or new elements may be added or replaced in the contents described and illustrated above, without departing from the scope and spirit of the technology of the present disclosure. In addition, particularly, description related to common technical knowledge or the like that does not need to be described in terms of embodying the technology of the present disclosure is omitted in the above described contents and the illustrated contents in order to avoid complication and facilitate understanding of the parts according to the embodiments of the technology of the present disclosure.

All documents, patent applications, and technical standards described in the present specification are incorporated into the present specification by reference to the same extent as in a case where the individual documents, patent applications, and technical standards were specifically and individually stated to be incorporated by reference.

What is claimed is:

1. A film forming device that deposits, on a substrate, a product generated by decomposing raw material gas by a plasma discharged from a discharge port of a double tube, the device comprising:
    an inner tube through which raw material gas containing a film-forming raw material flows and is guided to the discharge port on a downstream side;
    an outer tube that has the inner tube inserted thereinto and through which plasma-generating gas flows and a plasma generated by an electric discharge is guided to the discharge port on the downstream side;
    a first electrode that is formed in an annular shape around the outer tube and grounded; and
    a second electrode that is formed in an annular shape around the outer tube and to which a voltage is applied,
    wherein the second electrode is disposed on the downstream side with respect to the first electrode, and assuming that a length of the second electrode in an axial direction is L1 and a diameter of the outer tube is D1, a relationship of L1≥D1 is satisfied, and
    wherein no other electrodes are disposed between the second electrode and the discharge port.

2. The film forming device according to claim 1, wherein a relationship of 1≤L1/D1≤10 is satisfied.

3. The film forming device according to claim 1, wherein assuming that a diameter of the inner tube is D2, a relationship of D2/D1≤0.7 is satisfied.

4. The film forming device according to claim 1, wherein, at the discharge port, a protrusion amount of an end part of the inner tube in the axial direction with respect to an end part of the outer tube is more than 0 mm.

5. The film forming device according to claim 1, wherein the substrate is an insulator, and a third electrode is formed on a surface of the substrate opposite to a surface facing the discharge port.

6. The film forming device according to claim 5, wherein the third electrode is grounded.

7. The film forming device according to claim 5, wherein a negative voltage is applied to the third electrode.

8. The film forming device according to claim 7, wherein the negative voltage applied to the third electrode is a direct current or a direct current pulse.

9. The film forming device according to claim 1, further comprising:
    a transport unit that relatively moves the substrate with respect to the discharge port.

10. The film forming device according to claim 1, wherein an AC voltage or a pulsed voltage having a frequency of 500 kHz or less is applied to the second electrode.

* * * * *